United States Patent Office 3,158,517

Patented Nov. 24, 1964

3,158,517

PROCESS FOR FORMING RECESSES IN SEMI-CONDUCTOR BODIES

Horst Schwarzenberger, Heilbronn, Germany, assignor to Telefunken Gesellschaft mit beschrankter Haftung, Hannover, Germany No Drawing. Filed Oct. 27, 1960, Ser. No. 65,267
Claims priority, application Germany Nov. 5, 1959
6 Claims. (Cl. 156—17)

The present invention relates to the manufacture of semi-conductor bodies, more particularly, to a process of etching recesses in semi-conductor bodies and to an improved solution for use in the etching process.

One of the ever-recurring problems in the manufacture of semi-conductor bodies is the accurate positioning of the emitter and collector blocking layers. This problem, for example, occurs in the manufacture of transistors from alloys wherein the distances between the pn-junctions are limited to the order of several microns. This problem can readily be solved if very thin laminations of semi-conductor material are used. However, if it is necessary to use relatively thick laminations of semi-conductor materials to achieve greater stability this problem cannot be solved so easily because small distances between the pn-junctions can only be obtained by a very deep alloying.

The problem of obtaining a certain depth or thickness of the alloy material is, however, a critical problem. The depth of the applied alloy material will largely depend on the dimensions of the semi-conductor surface wetted or contacted by the alloy material. For this reason minute fluctuations in the area of the wetted surface will result in large fluctuations in the depth of the alloy material in the semiconductor body.

One proposed solution to the above problem was to etch recesses in the semi-conductor body on those places where it was desired to apply the alloy material. If these recesses are correctly dimensioned the alloy material will fill the recess and will not escape to contact additional semi-conductor material. Accordingly, the dimensions of the blocking layer can be reduced somewhat and will be more accurate than would be possible without etching these recesses.

In utilizing this procedure great care must be taken to accurately position the etched recesses exactly opposite to each other in the semi-conductor body before the alloy material is applied to the recess. One process by which the etched recesses can be accurately located is by a so-called photo-resist process.

This process essentially comprises initially coating the semi-conductor body with a photo-resist lacquer. This lacquer is a common item and one type which is commonly used is the Kodak "Photo-resist Lacquer." The coated body is then exposed to light with the exception of the recess area which is either covered with an opaque material or by shading the light from the recess area in any other suitable manner. The exposed lacquer coating is then developed. The undeveloped lacquered area, which represents the recess area, is then removed in a suitable way which also is well known in the art. An etching solution is then applied to the lacquer-free area. The etching action is permitted to continue until the desired depth of the recess is obtained. The etchant is then removed and the recess washed out so as to ensure the cessation of the etching action.

One of the problems encountered in using the above process is that the lacquer which is conventionally used is attacked by the etching solution. Thus, inaccurate recesses may result.

The present invention improves the above etching process by providing a new and improved etching solution which does not attack the lacquer conventionally used to coat the semi-conductor body. This etching solution is neutral or substantially neutral and contains as its major components ammonium fluoride and hydrogen peroxide. This solution will accurately etch the recesses and the bottoms of the recesses will be free from pits which occasionally are formed by some etching solutions. Further, this etching solution can be generally used for etching of semi-conductor materials.

It is, therefore, the principal object of this invention to provide a novel and improved process for etching recesses in semi-conductor bodies.

It is another object of the invention to provide a process for etching recesses in semi-conductor bodies wherein the etchant is neutral with respect to the lacquer covering those areas of the bodies which are not to be etched.

It is a further object of this invention to provide an improved etching solution for the etching of recesses in semi-conductor bodies.

The etching solution disclosed in this invention consists of 1000 milliliters of $H_2O$, of 100 grams of ammonium fluoride and 2 milliliters of a 30% solution of hydrogen peroxide. This solution will have pH value of 6.1. A pH value of less than 6.0 can be used but as a general rule the value of the pH will depend on the specific lacquer employed in coating the semi-conductor body. It has been found that for the "Photo-resist Lacquer" mentioned previously, an etching solution having a pH value of 6.1 will be neutral to this lacquer. Excessive acid or alkalinity will attack this lacquer and, hence, it is important that the etching solution be neutral with respect thereto.

This etching solution can also be used for other lacquers which are somewhat similar in composition to the particular lacquer described above. Since the etching solution described above has neither an acid nor an alkaline character it will attack only the semi-conductor material and not the photo-resist lacquer.

This etching solution can also be used for other semi-conductor materials in addition to germanium and silicon which are commonly used.

Thus it will be seen that the present invention provides an improved process for etching recesses in semi-conductor bodies and also an improved etching solution which will not attack the lacquer commonly used for coating semi-conductor bodies. As a result, increased accuracy may be obtained in both the dimensioning and the positioning of the recesses into which the alloy material will be placed.

It will be understood that this invention is susceptible to further modification and, accordingly, it is desired to comprehend such modifications within this invention as may fall within the scope of the appended claims.

What I claim is:

1. In a process of forming a recess in a semi-conductor body, the steps comprising coating the semi-conductor body with a photo-resist lacquer; eliminating the lacquer from areas, in which the recess is to be formed; and applynig a substantially neutral aqueous etchant consisting essentially of ammonium fluoride and hydrogen peroxide to the uncovered area of the semiconductor body to form a recess therein.

2. In a process of forming a recess as claimed in claim 1 with said etching solution consisting essentially of 1000 milliliters $H_2O$, 100 grams ammonium fluoride, and 2 milliliters of a 30% solution of hydrogen peroxide.

3. A composition for etching a semi-conductor body and consisting essentially of 1000 milliliters $H_2O$, 100 grams ammonium fluoride, and 2 milliliters of a 30% solution of hydrogen peroxide.

4. A composition for etching a semi-conductor body and consisting essentially of 1000 milliliters $H_2O$, 100 grams ammonium fluoride, and 2 milliliters of a 30% solution of hydrogen peroxide, said composition having a pH value of about 6.1.

5. In a process for forming a recess as claimed in claim 1 with said etching solution consisting essentially of 1000 milliliters $H_2O$, 100 grams of a 10% solution of ammonium fluoride, and 2 milliliters of a 30% solution of hydrogen peroxide.

6. A composition for etching a semi-conductor body and consisting essentially of 1000 milliliters $H_2O$, 100 grams of a 10% solution of ammonium fluoride, and 2 milliliters of a 30% solution of hydrogen peroxide, said composition having a pH value of about 6.1.

References Cited in the file of this patent

UNITED STATES PATENTS

| | | |
|---|---|---|
| 1,997,375 | Naruse | Apr. 9, 1935 |
| 2,411,298 | Shore | Nov. 19, 1946 |
| 2,542,727 | Theuerer | Feb. 20, 1951 |
| 2,606,960 | Little | Aug. 12, 1952 |
| 2,705,392 | Imler | Apr. 5, 1955 |
| 2,739,882 | Ellis | Mar. 27, 1956 |
| 2,876,144 | Bomberger et al. | Mar. 3, 1959 |
| 2,921,836 | McCord et al. | Jan. 19, 1960 |
| 2,965,521 | Bomberger et al. | Dec. 20, 1960 |
| 2,990,282 | Wicke | June 27, 1961 |
| 3,041,258 | Sikina | June 26, 1962 |
| 3,079,254 | Rowe | Feb. 26, 1963 |